United States Patent [19]

Kaganowicz et al.

[11] Patent Number: 4,692,344
[45] Date of Patent: Sep. 8, 1987

[54] METHOD OF FORMING A DIELECTRIC FILM AND SEMICONDUCTOR DEVICE INCLUDING SAID FILM

[75] Inventors: Grzegorz Kaganowicz, Belle Mead; Alfred C. Ipri; Richard S. Crandall, both of Princeton, all of N.J.

[73] Assignee: RCA Corporation, Princeton, N.J.

[21] Appl. No.: 834,384

[22] Filed: Feb. 28, 1986

[51] Int. Cl.⁴ .......................................... H01L 21/318
[52] U.S. Cl. ...................................... 427/39; 437/241
[58] Field of Search ............................. 427/38, 39, 94

[56] References Cited

U.S. PATENT DOCUMENTS

| | | | |
|---|---|---|---|
| 3,412,297 | 11/1968 | Amlinger. | |
| 4,142,004 | 2/1979 | Hauser | 427/94 |
| 4,282,267 | 8/1981 | Küyel | 427/94 |
| 4,331,709 | 5/1982 | Risch | 427/94 |
| 4,342,617 | 8/1982 | Fu | 427/38 |
| 4,443,933 | 4/1984 | de Brebisson. | |
| 4,513,021 | 4/1985 | Purdes | 427/94 |
| 4,530,149 | 7/1985 | Jastrzebski et al. | |
| 4,576,829 | 3/1986 | Kaganowicz | 427/39 |

OTHER PUBLICATIONS

Morosanu et al., "Thin Film Preparation by Plasma and LPCVD in a Horizontal Reactor", Vacuum, vol. 31, No. 7, pp. 309-313, Dec. 1981.
Hezel et al., "Plasma Si Nitride . . .", J. Appl. Phys., 52(4), Apr. 1981, pp. 3076-3079.

*Primary Examiner*—John D. Smith
*Attorney, Agent, or Firm*—Eugene M. Whitacre; William J. Burke

[57] ABSTRACT

A method for forming a dielectric film over a semiconductor device is disclosed. The body of semiconductor material is formed and a hydrogen-containing silicon nitride material substantially free of silicon-hydrogen bonds is formed thereover.

Also disclosed is a semiconductor device, including a body of semiconductor material and a dielectric film thereover. The dielectric film is a hydrogen-containing silicon nitride material substantially free of silicon-to-hydrogen bonds.

6 Claims, 2 Drawing Figures

METHOD OF FORMING A DIELECTRIC FILM AND SEMICONDUCTOR DEVICE INCLUDING SAID FILM

The present invention relates to a method of forming a dielectric film on a semiconductor body and a semiconductor device fabricated by such a method.

BACKGROUND OF THE INVENTION

Dielectric materials such as silicon oxides are widely used in the manufacture of semiconductor devices. These materials find use not only as final passivation coatings for completed devices but also as intermediate insulatng layers for multi-layer devices. Thermally grown silicon oxides are typically employed as dielectric films, e.g. a gate dielectric, in semiconductor devices such as EAROMs (electrically alterable read only memory), MOSFETs (metal-oxide-semiconductor field effect transistor), capacitors and the like. Thermal oxidation methods, which produce the best silicon oxide films, are usually carried out by placing silicon in an oxygen ambient at temperatures between 800° and 1200° C.

These temperatures can be tolerated by silicon substrates, but in some situations the above temperatures are too high for the substrate. For example, in applications where the dielectric film to be formed is part of a semiconductor device being fabricated over a glass substrate, lower processing temperatures are required. Specifically, in the area of liquid crystal displays, thin film transistors are fabricated over glass substrates which have a softening point of about 650° C. Therefore, to thermally grow an oxide from silicon over a glass substrate, the temperature of the substrate in the oxygen ambient must be kept at about 600° C. or below. This temperature requires about 120 hours to grow a 60–70 nanometers (nm) thick layer of silicon oxide. This is not practical.

Silicon oxides, aluminum oxide, and silicon nitride dielectric layers can be deposited at temperatures below 600° C. by glow discharge and other chemical vapor deposition (CVD) techniques, in a fraction of the time required for thermal growth, e.g. a few hours or less. However, the dielectric quality of the deposited film is poor compared to the thermally grown silicon oxide. Specifically, the transistor turn on voltage for deposited silicon dioxide films is typically unstable which is not true for thermally grown films. It is believed that charge traps within the film and/or at the silicon-dielectric interface cause the film to accumulate a charge upon the initial applications of voltage. Subsequent applications of voltage are characterized by a shift in the turn-on, or threshold, voltage of 5 to 10 volts or more, compared to little or no shift in the threshold voltage for thermally grown oxide.

Further, in applications requiring a dielectric layer over hydrogenated amorphous silicon, it is desirable to keep processing temperatures below about 400° C. This is because the semiconductive properties of amorphous silicon change at temperatures above 400° C., probably due to a loss of hydrogen from the film at elevated temperatures.

It would be desirable therefore to have a method of producing a dielectric film at a temperature below 600° C. and preferably below 400° C. wherein the rate of film formation is substantially increased over thermally grown films in that temperature range without a substantial sacrifice in dielectric stability.

SUMMARY OF THE INVENTION

A method for forming a dielectric film over a semiconductor device is disclosed. The body of semiconductor material is formed and a hydrogen-containing silicon nitride material substantially free of silicon-hydrogen bonds is formed thereover.

Also disclosed is a semiconductor device, including a body of semiconductor material and a dielectric film thereover. The dielectric film is a hydrogen-containing silicon nitride material substantially free of silicon-to-hydrogen bonds.

DETAILED DESCRIPTION OF THE PREFERRED EMBODIMENTS

The present invention provides a silicon nitride dielectric material with enhanced electrical stability, which can conveniently be deposited at temperatures below 300° C. and preferably between about 25° C. and 100° C. The dielectric material, which can be deposited by CVD methods such as the glow discharge (plasma enhanced chemical vapor deposition) technique, comprises silicon, nitrogen and hydrogen, but substantially free of silicon-to-hydrogen bonds. Although there may actually be a small amount of silicon-to-hydrogen bonds, by substantially free is meant that no such bonds are detected during infrared (IR) analysis.

In the fabrication of semiconductor devices, e.g. FETs which employ a gate dielectric interposed between a body of semiconductor material and an electrode, a thin layer of grown oxide over the semiconductor preferably precedes the deposition of the silicon nitride dielectric.

Figure 1:
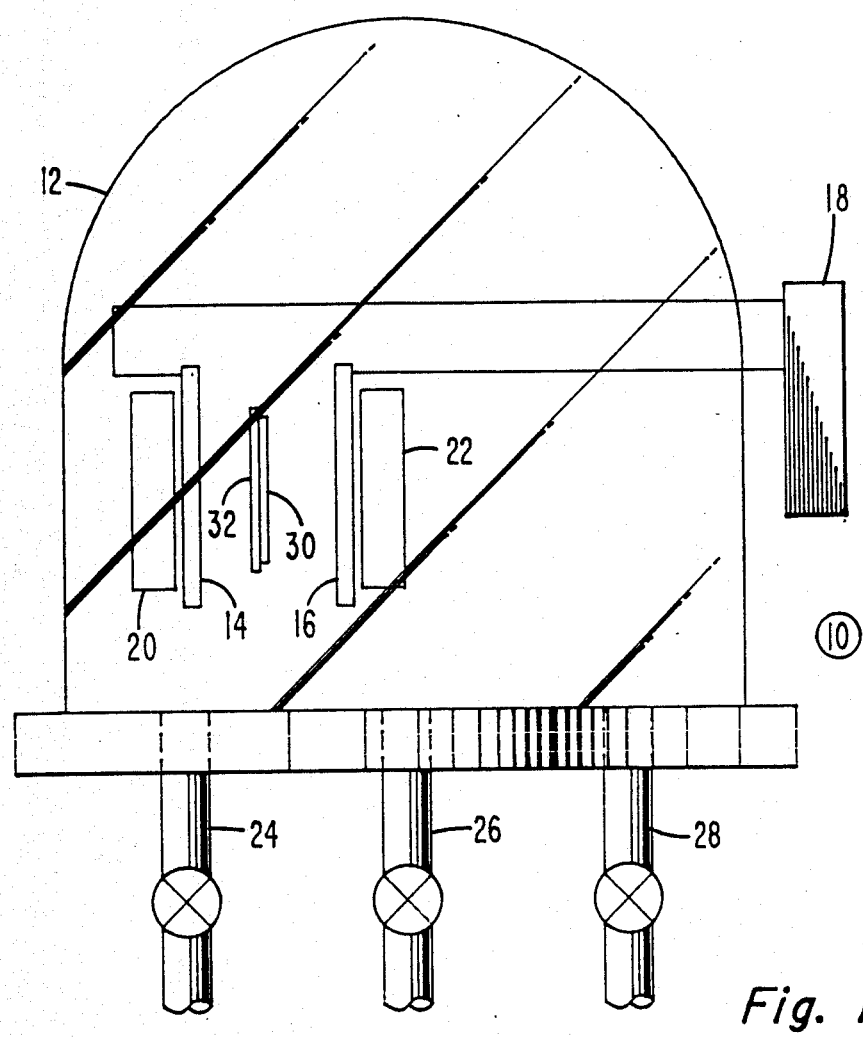
FIG. 1 is a cross-sectional view of an apparatus suitable for forming the dielectric film for the device of the present invention.

An apparatus suitable for carrying out the present process is illustrated in FIG. 1. The apparatus 10 includes a vacuum chamber 12 which can be a glass bell jar. In the vacuum chamber 12 are electrodes 14 and 16 which can be a screen, coil or plate of a material that is a good electrical conductor, such a aluminum. The electrodes 14 and 16 are connected to a power supply 18, which may be DC, AC or RF to produce a voltage potential. Behind the electrodes 14 and 16 are magnets 20 and 22 which are electrically insulated from the electrodes, which helps concentrate the plasma in the electrode area. An outlet 24 from the vacuum chamber 12 allows for evacuation of the system and is connected to a pumping station, not shown. A first inlet 26 and a second inlet 28 are connected to gas bleed systems, not shown, for adding the appropriate gas or gases. The apparatus also includes a heat source (not shown) to heat the ambient to a desired temperature.

To deposit the silicon nitride dielectric of the invention, the substrate 30 to be coated is affixed to the mounting plate 32. The vacuum chamber 12 is then evacuated through the outlet 24 to a pressure of about 0.2 to 1.0 $\times 10^{-6}$ Torr. Silane (SiH$_4$) and an appropriate nitrogen-containing precursor, e.g. ammonia (NH$_3$), are introduced into the chamber 12 through the inlet 26 to a pressure of about 50 Millitorr. About 50 to 600 watts of power, e.g. 13.56 MHz RF, is applied to the electrodes 14 and 16 to initiate the formation of plasma. During deposition, the temperature is maintained between about 25° and 300° C., preferably between 25° and 100° C. The flow rates of the $SiH_4$ and $NH_3$ and the power used to initiate the plasma are all interrelated in the deposition of silicon nitride films in accordance with this invention. Films deposited by the glow disharge of $SiH_4$ and $NH_3$ are characterized by between about 10 and 20 atomic percent of hydrogen and varying amounts of silicon and nitrogen depending on the deposition parameters. It has been found that silicon nitride materials substantially free of silicon-to-hydrogen bonds, as measured by infra-red (IR) analysis, generally have silicon to nitrogen ratios between about 0.45:1 and 0.80:1. Preferably, the silicon to nitrogen ratio is between about 0.65:1 and 0.80:1 when these hydrogen-containing silicon nitrides are used as, for example, gate dielectrics for FETs. Some of the deposition parameters and resultant films analyses are illustrated in Table 1.

TABLE I

| Flow Rates in SCCM | | Power | Silicon/ | Presence of Si—H |
|---|---|---|---|---|
| $NH_3$ | $SiH_4$ | (Watts) | Nitrogen | Bonds (yes/no) |
| 45 | 30 | 50 | 1.25:1 | yes |
| 45 | 20 | 100 | .66:1 | no |
| 45 | 35 | 100 | 1.12:1 | yes |
| 45 | 30 | 200 | .90:1 | yes |
| 45 | 30 | 300 | .71:1 | no |
| 45 | 15 | 400 | .56:1 | no |
| 45 | 20 | 400 | .73:1 | no |
| 45 | 30 | 400 | .81:1 | yes |
| 45 | 45 | 400 | 1.07:1 | yes |

The films represented in Table I included between about 10 and 20 atomic percent of hydrogen as measured by SIMS (secondary ion mass spectroscopy) analysis. The presence of Si-H bonds was determined by IR analysis and the silicon to nitrogen ratio was determined by Rutherford Back Scattering (RBS). The depositions of the films in Table I were carried out at a pressure of about 50 Millitorr and a temperature of about 30° C. The dielectric is deposited to a thickness of about 100 nanometers in about 300 seconds.

It has also been found that if a thin layer of silicon oxide is grown over the substrate prior to the silicon nitride deposition, the electrical stability of the dielectric film is even further improved. In this case the substrate 30 must be of silicon or alternatively must have a thin layer of silicon thereover. The silicon oxide can be grown by techniques known in the art including a low temperature plasma oxidation process described by Kaganowicz et al. in a copending application, Ser. No. 687,366 filed Dec. 28, 1984. In this process the silicon surface is subjected to a plasma in the presence of oxygen wherein the temperature is maintained between about 100° and 300° C. and wherein the effective power density is preferably between about 5 and 7 watts per square centimeter of electrode. The silicon nitride material can then be deposited over the silicon oxide as described above.

Figure 2:
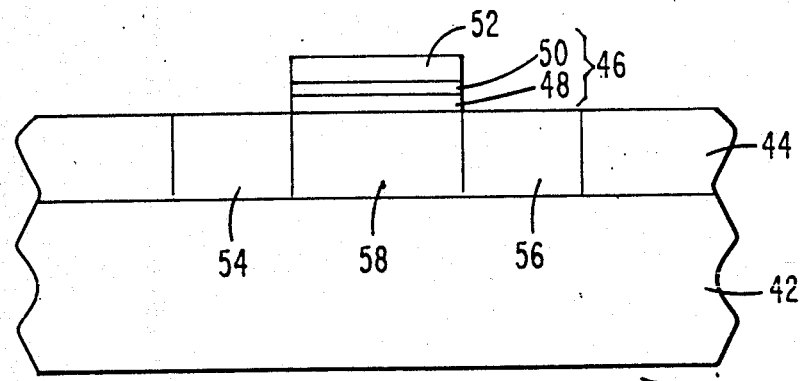
FIG. 2 is a cross-sectional view of a semiconductor device of the present invention.

FIG. 2 illustrates one embodiment of the present invention; a field effect transistor (FET) 40. It should be noted, however, that any semiconductor device requiring a high quality thin film dielectric would benefit by the present invention.

The transistor device 40 is fabricated by means known in the art. Over a glass substrate 42 is deposited an amorphous silicon layer 44 of a first conductivity type. Then a dielectric film 46 of the present invention comprising the optional silicon oxide region 48 and the hydrogen-containing silicon nitride region 50 are deposited over said silicon layer 44 by the methods outlined in detail above. An electrode 52 which serves as a gate in this device and which is a conductor, e.g. metal, silicides, polysilicon, is deposited over the dielectric 46 and patterned using standard photolithography techniques. Using self-aligned ion implant techniques, the silicon layer 44 can be provided with source 54 and drain 56 regions of the second conductivity type. Although the device 40 is shown in FIG. 2 to have a continuous silicon layer 44, a silicon island is preferably formed by known techniques which comprises only the source 54, drain 56 and channel 58 regions.

In the dielectric film 46 the oxide layer 48, if used, should be between about 3 and 20 nanometers thick. The silicon-nitride region 50 should be between about 50 and 300 nanometers thick and preferably between about 80 and 150 nanometers thick.

A typical test known in the art to measure the stability of a dielectric film is the CV (capacitance-voltage) test for an MIS (metal-insulator-silicon) capacitor wherein the dielectric film to be characterized is the insulator. A range of voltages is applied to the capacitor and shifts in the flatband voltage due to charge trapping at the silicon-insulator interface are observed. Thermally grown silicon oxides exhibit little or no voltage shift. In dielectric films deposited by prior art low temperature methods, voltage shifts of 5 to 10 volts and more are common. Silicon nitride dielectric films outside of the range defined by the present invention generally were found to have shifts between 10 and 20 volts. Silicon nitride films substantially free of silicon-to-hydrogen bonds provide voltage shifts of only between 2.5 and 5.0 volts. Dielectric films comprising about 100 nm of the silicon nitride of the present invention over about 5 nm of a grown silicon oxide provided voltage shifts on the order of 0.4 to 1.0 volts, comparable to oxides thermally grown at much higher temperatures for significantly longer times The silicon nitride material of the present invention, preferably over silicon oxide, provides not only enhanced device stability comparable to thermally grown oxides, but the method of depositing this material allows deposition at temperatures as low as 25° C. at reasonable deposition rates on the order of 20 nanometers per minute.

We claim:
1. A method of forming a dielectric film on a semiconductor body comprising
    subjecting a first major surface of said semiconductor body to a glow discharge in the presence of silane and a nitrogen-containing material; and
    depositing a hydrogen-containing, silicon nitride film substantially free of silicon-to-hydrogen bonds, over said first major surface, said silicon nitride film having a silicon to nitrogen ratio of between about 0.65:1 and 0.80:1.
2. The method of claim 1 wherein the deposition temperature is between about 25° and 300° C.
3. The method of claim 2 wherein the deposition temperature is between about 25° and 100° C.
4. The method of claim 1 wherein at least the first major surface of said semiconductor body comprises silicon.
5. The method of claim 4 wherein the first major surface is oxidized prior to depositing the hydrogen-containing silicon nitride thereover.
6. The method of claim 1 wherein said silicon nitride comprises between about 10 and 20 atomic percent of hydrogen.

* * * * *